Figure 1:
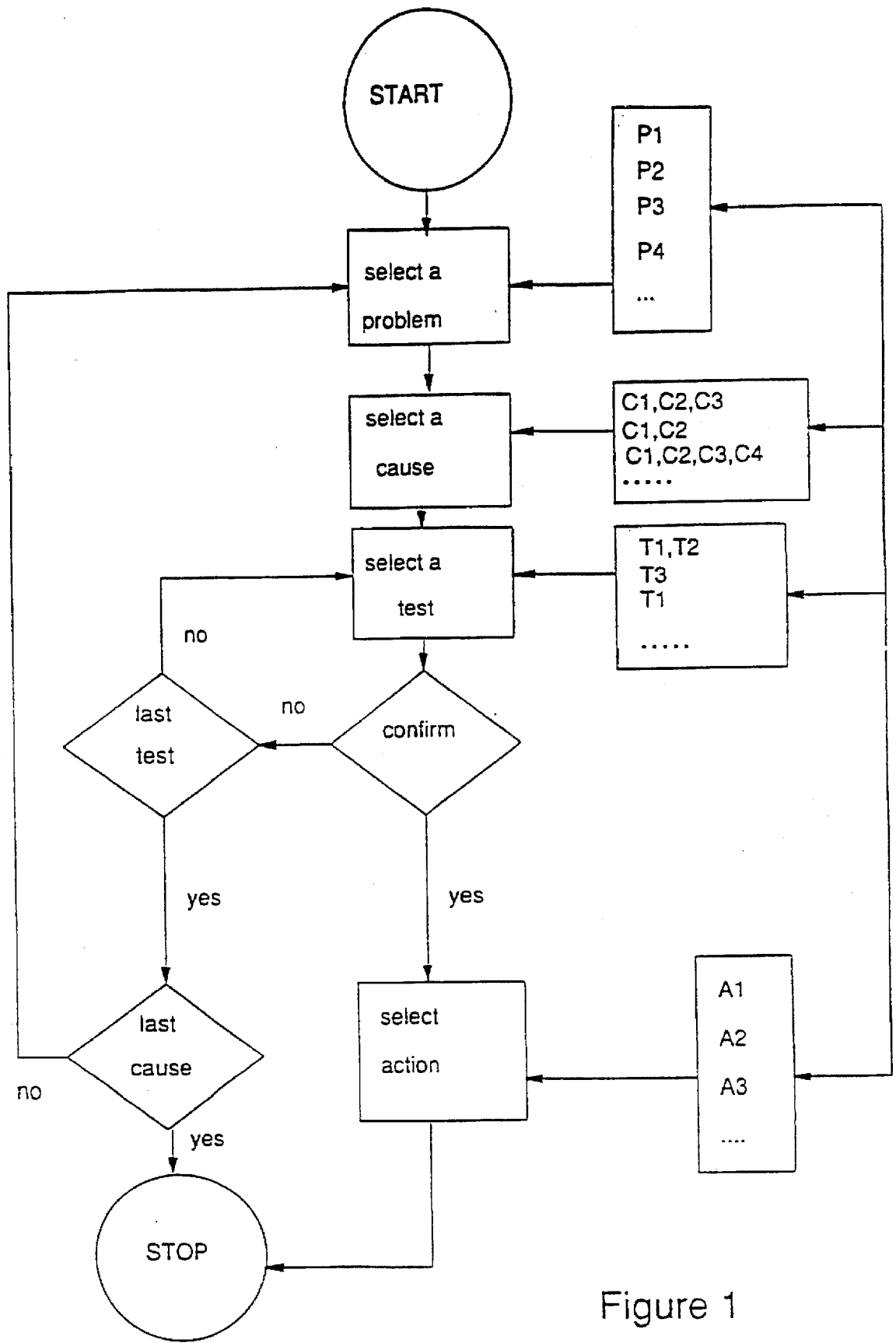

United States Patent [19]

Claes et al.

[11] Patent Number: 5,663,898
[45] Date of Patent: Sep. 2, 1997

[54] TOOLKIT AND METHOD FOR DIAGNOSING A PROBLEM OF BAD PERFORMANCE OF A LITHOGRAPHIC PRINTING PLATE OBTAINED ACCORDING TO THE SILVER SALT DIFFUSION TRANSFER PROCESS

[75] Inventors: Jan Claes, Mortsel; Paul Coppens, Turnhout; Dave Van den Bergh, Hove, all of Belgium

[73] Assignee: Agfa-Gevaert N.V., Mortsel, Belgium

[21] Appl. No.: 627,286

[22] Filed: Apr. 4, 1996

[30] Foreign Application Priority Data

Apr. 7, 1995 [EP] European Pat. Off. ............ 95200883

[51] Int. Cl.[6] .................................................. G03C 5/26
[52] U.S. Cl. ........................... 364/551.01; 364/571.07; 364/525; 430/204
[58] Field of Search ........................ 364/551.01, 525, 364/571.07; 430/204; 356/446; 355/72; G03F 7/07; G03C 5/26

[56] References Cited

U.S. PATENT DOCUMENTS

| | | | |
|---|---|---|---|
| 5,217,855 | 6/1993 | Okada et al. | 430/488 |
| 5,587,271 | 12/1996 | Heugebaert et al. | 430/204 |
| 5,597,676 | 1/1997 | Van Rompuy et al. | 430/204 |

FOREIGN PATENT DOCUMENTS

| | | | |
|---|---|---|---|
| 95200883 | 7/1995 | European Pat. Off. | G03C 5/26 |
| 5005998 | 5/1993 | Japan . | |
| 5305286 | 2/1994 | Japan . | |
| 6613533 | 3/1968 | Netherlands . | |

OTHER PUBLICATIONS

"Application of digital image analysis techniques to photographic film defect test method development"; E./D. Cohen et al; Journal of Image Science abnd Technology, vol. 37, No.2 Mar. 2, 1993.

*Primary Examiner*—James P. Trammell
*Assistant Examiner*—Kamini S. Shah
*Attorney, Agent, or Firm*—Brumbaugh, Graves, Donohue & Raymond

[57] ABSTRACT

A method is disclosed for diagnosing the cause of bad performance of a printing plate obtained using the silver salt diffusion transfer process. According to the method a problem table is used to relate a problem to one or more possible causes. A test table is used to identify tests to verify a possible cause of the problem and a toolkit is provided including equipment needed for carrying out tests. Using the method a technician can identify possible causes for a problem, identify the tests capable of verifying one or more causes and perform the tests to confirm the cause of the problem. In the event a cause is not confirmed the technician can investigate other possible causes.

6 Claims, 1 Drawing Sheet

5,663,898

TOOLKIT AND METHOD FOR DIAGNOSING A PROBLEM OF BAD PERFORMANCE OF A LITHOGRAPHIC PRINTING PLATE OBTAINED ACCORDING TO THE SILVER SALT DIFFUSION TRANSFER PROCESS

DESCRIPTION

1. Field of the Invention

The present invention relates to a diagnosing method to find the cause of a problem of bad performance of a printing plate obtained according to the silver salt diffusion transfer process.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

For example EP-A-410500 discloses a lithographic printing plate precursor, also called an imaging element hereinafter, containing an aluminium support provided with in the order given an image receiving layer containing physical development nuclei and a photosensitive layer containing a silver halide emulsion. According to the there disclosed method for obtaining a lithographic printing plate said imaging element is image-wise exposed and subsequently developed using a developing liquid or activating liquid in the presence of a silver halide complexing agent. The imaging element is then guided through a diffusion transfer zone so that the silver halide complexes formed during the development step are allowed to diffuse into the image-receiving layer where they are converted to silver. When the imaging element leaves the diffusion transfer zone a silver image is formed in the image receiving layer. The now useless photosensitive layer and optional other layers above the image receiving layer are then removed by rinsing the imaging element in a washing section. Finally the element now carrying a silver image on its surface is treated with a finishing liquid that contains so called hydrophobizing agents for improving the hydrophobicity of the silver image.

A lithographic printing plate precursor of the type as disclosed in EP-A-410500 is particular suitable for making printing plates to be used for printing newspapers, high quality print jobs, book printing etc.. Such printing jobs and in particular the printing of newspapers require a reliable processing of the lithographic printing plate precursors.

However, processing of an imaging element as described in EP-A-410500 requires a rather complicated processing involving at least three different processing sections and using three different processing liquids. Obviously, this increases the possibility of malfunction or of obtaining a printing plate not meeting the demands of the printing job. Often, the cause of such performance problem is not immediately apparent to the user who will then have to rely on a service engineer. Such service engineer may however not immediately be available and moreover often involves large expenses for both the customer and manufacturer or supplier of the equipement.

It has further been found that the user often gives confusing information about the performance problem of the printing plate and sometimes even includes his own views about the problem leading a service engineer to seek a solution to the wrong problem.

3. Summary of Invention

An object of the present invention is to provide a solution to aforementioned problems.

Further objects of this invention will become clear from the description hereinafter.

The present invention provides a method and toolkit as set out in the claims.

4. Brief Description of the Drawings

The present invention is illustrated by means of a flow chart setting out the steps to be taken in accordance with a particular embodiment of the method of the present invention.

5. Detailed Description of the Invention

It has been found that performance problems of a lithographic printing plate obtained from an imaging element, also called lithographic printing plate precursor, according to the silver salt diffusion transfer process can be more efficiently diagnosed using the method of the present invention.

Referring now to FIG. 1: when a performance problem occurs, the problem is compared to a problem table listing one or more problem descriptions that may occur. A user seeking to find a cause of the problem is thereby forced to select a problem description that most closely resembles the problem that is observed with the printing plate. Such offers the advantage that interpretations of the occurring problem by a user are ruled out.

Next, a possible cause which is preferably the most likely cause of the selected problem, is retrieved from a cause table relating one or more possible causes to a problem. The cause table will preferably contain an indication of the likeliness that the particular cause may actually cause the selected problem. This offers the advantage that the cause of a problem may be found more easily than in case no discrimination is made between possible causes.

For example, a selected problem may be that the obtained printing plate shows no or only a weak broken image. Possible causes for such problem that may be contained in the cause table are e.g. overexposure of the imaging element, an insufficient vacuum between the imaging element and original upon exposure, an exhausted developer, unsuitable darkroom conditions.

The cause table may then contain a number for each cause indicating the likeliness that said cause is causing the selected problem. Thus, in the above example the most likely causes for the problem would be an overexposure and unsuitable darkroom conditions whereas an insufficient vacuum and exhausted developer would be decreasingly likely to cause the problem.

In accordance with a preferred embodiment of the method of the present invention, the user takes the most likely cause as an entry of a test table relating the cause to one or more tests to be undertaken by the user so as to verify whether the selected cause actually causes said problem or not. Thus, again in the above example, the overexposure would be selected as the most likely cause and using this as an entry in the test table, the user would find that he should check the exposure by using a transmission stepwedge during exposure. The test will also include the expected results so that the user may verify whether the test confirms the cause to be a cause for the problem or not.

In the aforementioned example, the test would be considered to confirm the cause when the reproduced number of steps is too low. Supposing that the test confirms the cause, the user would then look up the actions to be taken from an action table relating a cause to one or more actions to cure said cause. In the above example, the action would be that the user has to decrease the exposure time until the test using the step wedge is successful.

On the other hand, if the test would not have confirmed the cause as a cause for the problem, a next possible cause would be retrieved from the cause table and the corresponding verifying tests be performed. This cycle is repeated until a test confirms a cause or until all possible causes for a particular problem are verified.

In the latter case, it may be appropriate for the user to fit his problem to another problem description. Although the method of the present invention will not find all causes to problems of bad performance of the printing plate, it allows to find most causes so that in about 90% of the occuring problem a cause and suitable cure may be found.

According to a preferred embodiment in connection with the present invention, the test table and action table may be combined into one table. Such may be effected by directly linking an action to be taken upon failure of a test.

The method of the present invention may be implemented in the form of a document comprising the different tables from which the user may manually look up problem descriptions, causes, tests and cures. However, according to a more preferred embodiment of the present invention, the method is automated by implementing it on a computing means.

Such computing means comprises a display and an input means, for example a keyboard or mouse, enabling the user to select a problem. The computing means will further comprise storing means, e.g. a disk and/or memory chip, for holding the problem table, cause table, test table and action table. The computing means will further comprise means for automatically retrieving the possible causes corresponding to the selected problem preferably in the order of likeliness that the particular cause may cause the selected problem. Further, upon retrieval of a possible cause, the computing means will display the test to be undertaken by the user and will then retrieve input from the user about the results of such tests.

Upon retrieval of the results of such test, the computing means will compare the obtained results with the expected results and will automatically select a next possible cause with related test, if the test did not confirm the cause or will return to the selection of a new problem, if no more causes are found for the selected problem. Conveniently, the means for automating the retrieval of problems, associated causes and tests may be implemented in the form of a software controlling operation of the computing means which e.g. is a personal computer.

According to the present invention there is further provided a toolkit for performing one or more tests contained in the test table used in accordance with the method of the present invention. In particular it has been found that such toolkit preferably contains at least the following elements to enable a fast diagnosing of most of the performance problems of a printing plate obtained according to the silver salt diffusion transfer process.

The preferred essential elements of such toolkit are a pH measurement unit and a pre-exposed sample lithographic printing plate precursor. The pre-exposed sample or samples of a lithographic printing plate precursor, allow the user to discriminate between causes of problems occurring during exposure or printing and causes of problems occurring during development since the pre-exposed sample is exposed by the supplier under strictly controlled and optimal conditions. Such a pre-exposed sample thus allows to rapidly reduce the diagnosing of a problem to a particular section in the workflow of plate making.

Further, the pH-measurement unit allows for measurements of the pH of the different processing liquids used in processing an exposed imaging element. It has been found that such pH measurement gives a fairly good indication of the operating conditions of the processing unit.

Further, the toolkit preferably also contains a color chart allowing for a semi-quantification of the degree of pollution of a particular processing liquid, in particular of a washing liquid or finishing liquid. Such color chart conveniently comprises a number of color frames of the same color of which the density increases from one frame to the other. The user can simply take a sample of a particular processing liquid using a transparent container and then compare the color of sample with the color frames of the color chart to be used for the particular processing liquid.

The toolkit in accordance with the present invention preferably also contains a pair of spectacles having as spectacle-glasses a filter for the darkroomlight that can savely be used with the imaging element. Such a pair of spectacles allow a user to easily check whether the darkroom conditions are sufficient. Thus, if upon wearing the pair of spectacles the user can still see, the darkroom conditions will be insufficient because the only light that can penetrate through the filter glasses is light which is to be avoided in the darkroom.

The toolkit may further contain test originals for exposing on a printing plate. Such test originals conveniently include a continuous tone step wedge (transparent and/or reflective) and a screened step wedge. These test originals can then be used to adjust and check the exposure conditions.

We claim:

1. A method for diagnosing the cause of bad performance of a printing plate obtained according to the silver salt diffusion transfer process, said method involving the use of:

(i) a problem table containing a description of problems that may be observed with said printing plate;

(ii) a cause table relating one or more possible causes to one or more problems contained in said problem table;

(iii) a test table relating one or more tests to a cause so as to verify whether said cause causes said problem;

(iv) a toolkit comprising one or more means for carrying out tests contained in said test table;

(v) an action table relating a cause to one or more actions to be taken so as to cure said cause; and said method comprising the steps of:

(a) looking up a problem from said problem table fitting best to a problem experienced with said printing plate;

(b) looking up a possible cause for said problem from said cause table;

(c) looking up one or more tests from said test table relating said cause to one or more tests to verify whether said cause, causes said problem;

(d) performing said one or more tests optionally using means contained in said toolkit for carrying out said one or more tests;

(e) deciding whether said test confirms said cause as a cause for said problem or not by comparing obtained test results with desired results for said test;

(f) if said test confirms said cause as a cause for said problem, looking up necessary actions from said action table to cure said cause;

(g) if said test does not confirm said cause as a cause for said problem, looking up a next possible cause from said cause table and repeating steps (c) to (e) until a test confirms a cause for said problem or until all possible causes for said problem have been verified.

2. A method according to claim 1 wherein said toolkit comprises a pH measurement unit and a pre-exposed sample lithographic printing plate precursor.

3. A method according to claim 1 wherein said problem table, said cause table, said test table and said action table are stored in a storing means comprised in a computing means, said computing means further comprising input means for retrieving a problem and the results of said tests and means for automatically performing said steps (a) to (g) using said retrieved problem and said retrieved results.

4. A toolkit according to claim 2 further comprising a color chart for semi-quantification of the pollution of a processing liquid.

5. A toolkit according to claim 2 further comprising one or more test originals.

6. A toolkit according to claim 2 further comprising a pair of spectacles having as glasses a filter being opaque to darkroom light that may be used during darkroom handling of a lithographic printing plate precursor.

* * * * *